(12) United States Patent
Liao

(10) Patent No.: US 6,214,750 B1
(45) Date of Patent: Apr. 10, 2001

(54) ALTERNATIVE STRUCTURE TO SOI USING PROTON BEAMS

(75) Inventor: Chungpin Liao, Taichung (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 09/225,376

(22) Filed: Jan. 4, 1999

(51) Int. Cl.⁷ .......................... H01L 21/26; H01L 21/42; H01L 21/324; H01L 21/477

(52) U.S. Cl. .......................... 438/798; 438/795; 438/928; 438/948

(58) Field of Search .................................... 438/403, 473, 438/474, 475, 795, 928, 798, 948

(56) References Cited

U.S. PATENT DOCUMENTS

| | | | |
|---|---|---|---|
| 4,099,318 | * 7/1978 | Cooper | 29/578 |
| 4,124,826 | 11/1978 | Dixon et al. | 331/94.5 |
| 4,806,497 | 2/1989 | Adam et al. | 437/6 |
| 4,987,087 | 1/1991 | Voss | 437/6 |

\* cited by examiner

*Primary Examiner*—Chandra Chaudhari
*Assistant Examiner*—Nema Berezny
(74) *Attorney, Agent, or Firm*—George O. Saile; Stephen B. Ackerman

(57) ABSTRACT

An alternative to conventional SOI and dielectric filled trenches for electrical isolation of integrated circuits is disclosed. This has been achieved by using proton bombardment to form semi-insulating regions. For all embodiments, the process of the invention begins only after the integrated circuit has been fully formed. In a first embodiment, protons bombard the entire back surface of the wafer thereby forming a substrate of semi-insulating material (resistivity greater than $10^5$ ohm cm) on which the active and passive components rest. In the second embodiment, isolation trenches are formed by bombarding from the top surface through a contact mask formed by means of LIGA or similar technology. The third embodiment is a combination of the first two wherein both isolation regions and the semi-insulating substrate are formed.

20 Claims, 2 Drawing Sheets

ALTERNATIVE STRUCTURE TO SOI USING PROTON BEAMS

FIELD OF THE INVENTION

The invention relates to the general field of circuit isolation in integrated circuits with particular reference to deep trench isolation and silicon-on-insulator (SOI) technology.

BACKGROUND OF THE INVENTION

Integrated circuits are formed within a semiconductor wafer by using a series of well-known techniques such as thin film deposition, diffusion, ion implantation, etc. in combination with photolithography. This results in the formation of a variety of active and passive components near one surface of the wafer. These components are connected together by means of thin film wiring and generally are present at several levels separated by inter-metal dielectric layers. Usually, the topmost layer is made of dielectric and serves as a passivation layer for the entire structure.

An ongoing problem associated with integrated circuit technology is the electrical isolation of various components and/or sub circuits from one another. An early technique developed to solve this problem was LOCOS (local oxidation of silicon) wherein thick layers of oxide were formed locally. More recently this has been replaced by shallow and deep trench isolation. In this technique, trenches with near vertical sides are etched between the circuits and then filled with dielectric materials. This approach has the advantage of consuming less space between circuits than LOCOS does.

However, even deep trench isolation is not fully satisfactory when full isolation between circuits is required. This is particularly true when high speed analog circuits are involved. One approach to dealing with this has been the technology known as silicon on insulator (SOI) where the substrate that supports the integrated circuits is a sheet of insulator rather than the semiconductor material that forms the rest of the wafer beneath the active regions. A number of techniques for achieving this are in use including silicon on sapphire (SOS) where a layer of silicon is grown epitaxially on a sheet of sapphire.

SOS and other techniques such as FIPOS (Field isolation by porous silicon) or ion implanting oxygen beneath the active region are, in general, very expensive to implement. In addition, they suffer from a number of drawbacks that derive from the very fact that the insulator in SOI is too good (DC-wise)! For example, the entire semiconductor layer is now electrically floating and therefore subject to charge accumulation. Also, since the semiconductor layer is relatively thin, under some circumstances it may be prematurely consumed through oxidation. Yet another problem is power dissipation because of the poor thermal conductivity of the insulator even though SOI circuits can usually be operated at lower power. Additional problems associated with conventional SOI include vulnerability to electrostatic discharges and snapback in the device I-V characteristics. These arise because the electrically floating silicon film would accumulate static charge and eventually discharge and cause damage to devices built on it. In a similar fashion, a dynamic charge overload on the floating silicon film can cause local breakdown and thus decrease of device operating voltage while increasing its current.

A method to achieve full circuit isolation, of analog and digital regions, without the need to use SOI has been described by the present inventor and one other in patent application #081998/734, filed Dec. 29, 1997. They describe the formation of semi-insulating regions in a semiconductor through bombardment with a high energy particle beam, including protons. These semi-insulating regions extend through the full thickness of the wafer so relatively high energy radiation (15–30 Mev for protons) must be used. The invention also teaches use of a mask made of Al, Fe, or W and having a thickness between 0.1 and 2 mm.

In the course of searching the patent literature we did not come across any references that teach a solution to the problem of full isolation that is similar to that disclosed in the present invention. However, a number of references of interest were encountered. For example, Dixon et al. (U.S. Pat. No. 4,124,826 November 1978) form high resistivity zones within a gallium arsenide laser by means of proton bombardment. Proton energies of about 300 keV were used at a fluence of $3\times10^{15}/cm^2$. The penetration depth was about 2.4 microns.

Voss (U.S. Pat. No. 4,987,087 January 1991) teaches the use of a mask during proton bombardment of a semiconductor. Proton energy was 2–6 MeV at a fluence of $10^{11}$–$10^{13}/cm^2$. A key feature of the Voss process is an annealing step (250–350° C. for at least two hours) after proton bombardment.

Adam et al. (U.S. Pat. No. 4,806,497 February 1989) bombarded a semiconductor with several different ion species, including protons. Each species serves a different purpose, the protons being used to create recombination centers with a view to adjusting carrier lifetime. No details, such as penetration depth, particle energies, etc. are provided.

SUMMARY OF THE INVENTION

It has been an object of the present invention to provide a process for full electrical isolation of circuits, mainly for the separation of analog and digital regions, within an integrated semiconductor wafer.

Another object of the invention has been to provide trench isolation without the need for etching and re-filling (by CMP) with dielectric material.

Yet another object of the invention has been to provide the equivalent of SOI technology without the need to use a foreign layer of insulation.

These objects have been achieved by using proton bombardment to transform some of the silicon to semi-insulating regions. For all embodiments, the process of the invention begins only after the integrated circuit has been fully formed, but before packaging. In a first embodiment, protons bombard the entire back surface of the wafer thereby forming a substrate of semi-insulating material (resistivity of about $10^5$ ohm cm) on which the active and passive components and conventional trenches rest. In the second embodiment, isolation trenches are formed by bombarding from the top surface through a contact mask formed by means of LIGA or similar technology. The third embodiment is a combination of the first two wherein both isolation trenches and the semi-insulating substrate are formed.

DESCRIPTION OF THE PREFERRED EMBODIMENTS

The invention relies on the fact that semiconductors, including notably silicon, are subject to significant increases in resistivity after being bombarded by protons and other radiation species. Some data on this is provided in TABLE I below.

TABLE I

|  | N type SILICON | | P type SILICON | |
| --- | --- | --- | --- | --- |
|  | before proton irradation | after proton irradation | before proton irradation | after proton irradation |
| carrier density | $6 \times 10^{14}$ $cm^{-3}$ | $2 \times 10^{11}$ $cm^{-3}$ | $2 \times 10^{15}$ $cm^{-3}$ | $4.8 \times 10^{11}$ $cm^{-3}$ |
| mobility | 1,500 $cm^2/v.s.$ | 137 $cm^2/v.s.$ | 500 $cm^2/v.s.$ | 80.8 $cm^2/v.s.$ |
| resistivity | 7 ohm cm. | $2 \times 10^5$ ohm cm. | 7 ohm cm. | $2 \times 10^5$ ohm cm. |

As is evident from the above data, the proton radiation reduced both the carrier density as well as their mobility. Experiments have shown that such radiation induced resistivity in silicon is stable for several days at 300° C. and for at least 10 years if the silicon is maintained at room temperature. Even at typical circuit operating temperatures of about 50–60° C., the phase is estimated to be stable for at least 5 years. These resistivities, close to a megohm cm, are classified as semi-insulating and are high enough to provide effective electrical isolation in many circuit applications.

Figure 1:
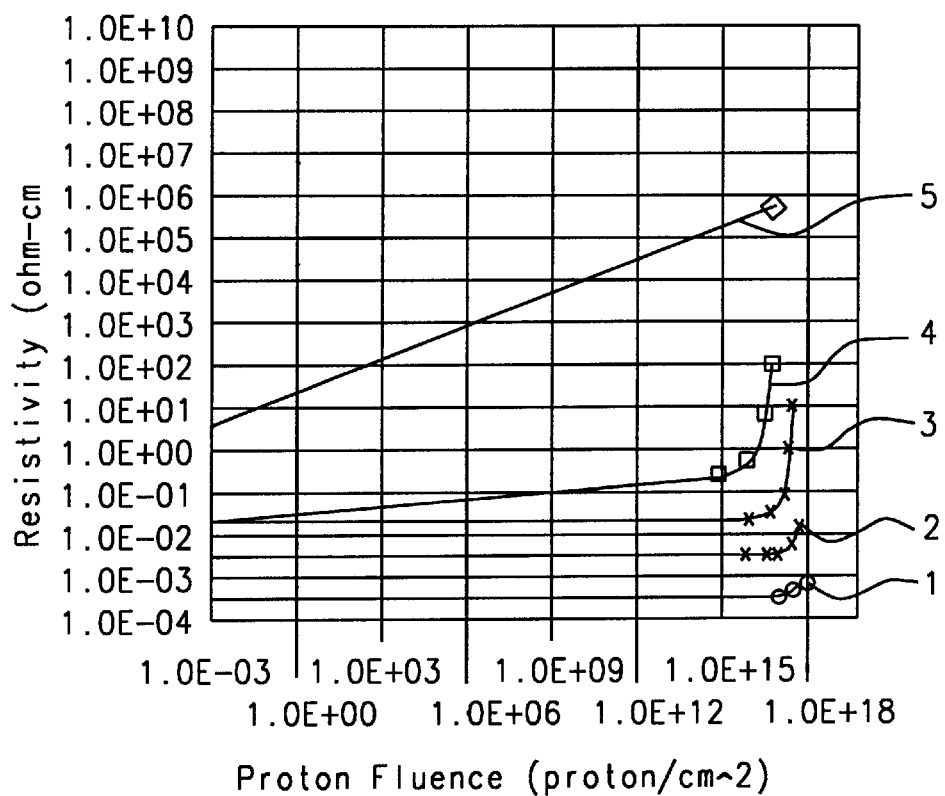
FIG. 1 is a curve of silicon resistivity as a function of proton fluence showing the importance of starting with the correct resistivity.

An important feature of the present invention is the correct choice of resistivity for the silicon material that is to be converted to semi-insulating through proton bombardment. In FIG. 1 we summarize the influence of starting resistivity on the resistivity that is achieved as a function of proton beam fluence. Curves 1 through 4 are the results of bombardment of relatively low resistivity material (less than about $10^{-2}$ ohm cm). Contrast this with the results obtained when the starting resistivity was between 1 and 10 ohm cm. as shown in curve 5.

Because the semi-insulating regions produced by proton bombardment are unstable over long periods if maintained at temperatures in excess of about 400° C., said regions are not to be formed until the manufacture of the integrated circuit is complete. Once this is the case, the process of the present invention can be implemented as will be described below. Note that although the embodiments described below are given in terms of silicon, the invention is not limited to this semiconductor and would still be applicable if other semiconductors such as germanium, gallium arsenide, silicon-germanium, indium phosphide, or gallium nitride were used.

First embodiment

Figure 2:
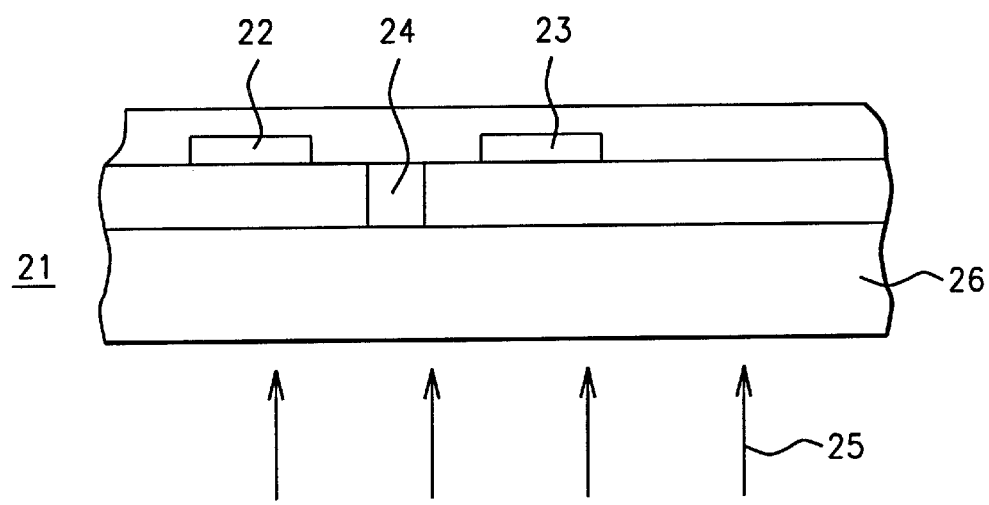
FIG. 2 illustrates the first embodiment of the invention wherein most of the wafer is converted to a semi-insulating substrate except near the top surface.

For this embodiment, it is assumed that the finished integrated circuit also includes conventional circuit isolation means such as trench isolation. Referring now to FIG. 2, we show silicon wafer 21 that includes a variety of active and passive components, including inter-component wiring, symbolized by areas 22 and 23. Providing partial electrical isolation between 22 and 23 is dielectric filled trench 24.

Arrows 25 symbolize the bombardment of the back side of wafer 21 by protons. In practice the proton beam has a diameter between about 0.1 and 2 cm. and must therefore be scanned (in raster fashion) over the surface of the wafer to cover the entire area. We have found a proton fluence between about $10^{15}$ and $10^{16}$ protons/cm$^2$ to be suitable for this purpose. The rate at which scanning occurs is such that any given area of the wafer experiences the given fluence for a period of between about 10 and 100 seconds at a proton flux of about $10^{14}$ protons/cm$^2$.sec.

The energy of the protons is chosen to be between about 5 and 12 MeV. At these energies the protons penetrate close to the bottom end of trench 24 thereby forming semi-insulating regions 26. The resistivity of the silicon in area 26 prior to the proton bombardment was between about 1 and 10 ohm cm while after proton bombardment it had increased to between about $10^5$ and $5 \times 10^5$ ohm cm.

Second Embodiment

Figure 3:
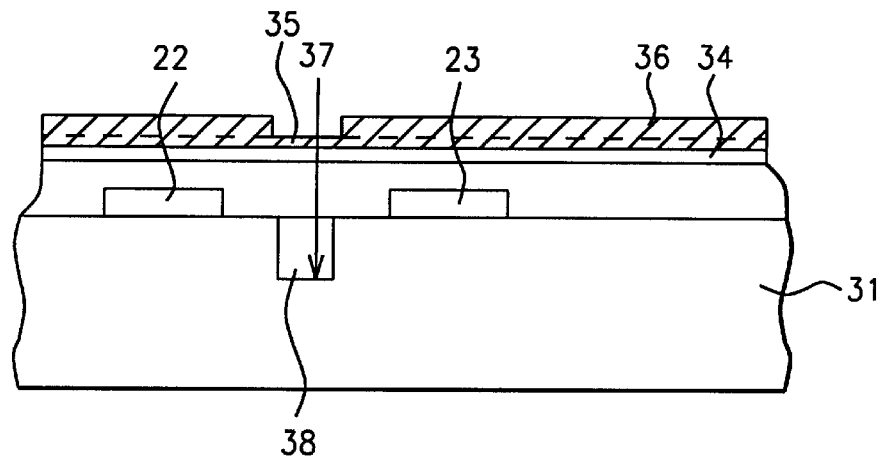
FIG. 3 illustrates the second embodiment of the invention wherein semi insulating trenches are formed through proton bombardment through a contact mask.

We refer now to FIG. 3. As in FIG. 2, an integrated circuit has been formed on the top surface of silicon wafer 21. As before, regions 22 and 23 symbolize integrated circuits made up of the a variety of active and passive components including inter-component wiring (not shown). Notably absent from the starting structure is any isolation between 22 and 23. It is the intent of this embodiment to provide this.

At the top surface of the integrated circuit is a final layer of passivation material shown as layer 34. The process for this embodiment begins with the deposition of metal layer 35 over the entire surface of 34. The purpose of layer 35 is to provide a 'seed' layer which will allow initial electrical continuity to an electrolyte bath for the deposition of a second layer which we will describe shortly. Layer 35 is generally chromium, gold, iron, or aluminum and is between about 100 and 1,000 Angstroms thick.

Next, a layer of photoresist (not shown) having a thickness between about 5 and 10 microns is laid down over layer 35. This is exposed through a suitable mask and then developed, resulting in a resist pattern that covers 35 everywhere except where it is intended to grow an additional layer of metal over 35.

The additional layer is layer 36. It is deposited by means of electroplating, to a thickness slightly less than that of the resist. Since the purpose of 36 is to block energetic protons, a material with relatively high atomic number is needed. The penetration distance of protons into several different materials is compared in TABLE II for several proton energies:

TABLE II

| Energy of H+ | silicon | aluminum | nickel | tungsten | gold |
| --- | --- | --- | --- | --- | --- |
| 1 MeV | 15.7 $\mu$ | 14.3 $\mu$ | 6.1 $\mu$ | 5.3$\mu$ | 5.4 $\mu$ |
| 5 | 213.7 | 189.8 | 72.5 | 57.0 | 57.9 |
| 15 | 1.4mm. | 1.3mm. | 452.1 | 309.0 | 330.0 |
| 30 | 4.8 | 4.3 | 1.5mm. | 978.5 | 1.0mm. |

Based on data such as shown in TABLE II, Ni/Fe was chosen as our preferred material although several others such as aluminum or gold could also have been used. Amongst the advantages of Ni/Fe is that it is easy to electroplate at relatively low temperatures. Once the growth of 36 is complete, the resist is removed, resulting in the contact mask seen in FIG. 3. Note that it is not necessary to remove those portions of layer 35 that did not receive additional metal since, because of its low thickness, the extent to which it will attenuate a beam of protons (or other radiation) is negligible.

We note here that the above process for forming a freestanding structure having a high aspect ratio is an example of LIGA (Lithographie, galvanoformung, und abformung) technology and any subprocesses and techniques applicable to LIGA would also be appropriate here.

With a contact mask in place, bombardment of the upper surface by protons can begin. The proton beam is symbolized by arrow 37. The energy of the protons is between about 1 and 1.6 MeV. This value is selected so that the depth of the resulting semi-insulating region 38 is between about 15 and 30 microns in silicon, achieving a better result which could not have been obtained using the more expensive and time consuming trench methods which in practice can extend at most about 7 microns into the silicon. At these energies a proton fluence between about $10^{15}$ and $10^{16}$ protons/cm$^2$ was used. Unlike the first embodiment, a full raster scan of the entire wafer surface is not necessary and scanning may be limited to the areas where semi-insulating regions are to be introduced. An extreme case of this, assuming perfect registration between the beam and the wafer, would be to eliminate the contact mask entirely. The rate of scanning at these areas was such that any given area was exposed to the beam for a period of between about 10 and 100 seconds for a proton beam flux of about $10^{14}$ protons/cm$^2$ sec.

The process of the second embodiment concludes with the removal of the contact mask (i.e. layers 35 and 36) by plasma etching. Note that the resistivity of the silicon in region 38 prior to the proton bombardment was between about 1 and 10 ohm cm while after proton bombardment it had increased to between about $10^5$ and $5\times10^5$ ohm cm.

Third Embodiment

The third embodiment of the present inventions is, effectively, a combination of the first and the second embodiments. The starting point for the process of this embodiment can be seen by referring to FIG. 3. As in FIG. 2, an integrated circuit is already present at the top surface of silicon wafer 21. As before, regions 22 and 23 symbolize a variety of active and passive components including inter-component wiring (not shown). Notably absent from the starting structure is any isolation between 22 and 23

At the top surface of the integrated circuit is a final layer of passivation material shown as layer 34. The process for this embodiment begins with the deposition of metal layer 35 over the entire surface of 34. The purpose of layer 35 is to provide a 'seed' layer which will allow initial electrical continuity to an electrolyte bath for the deposition of a second layer.

Figure 4:
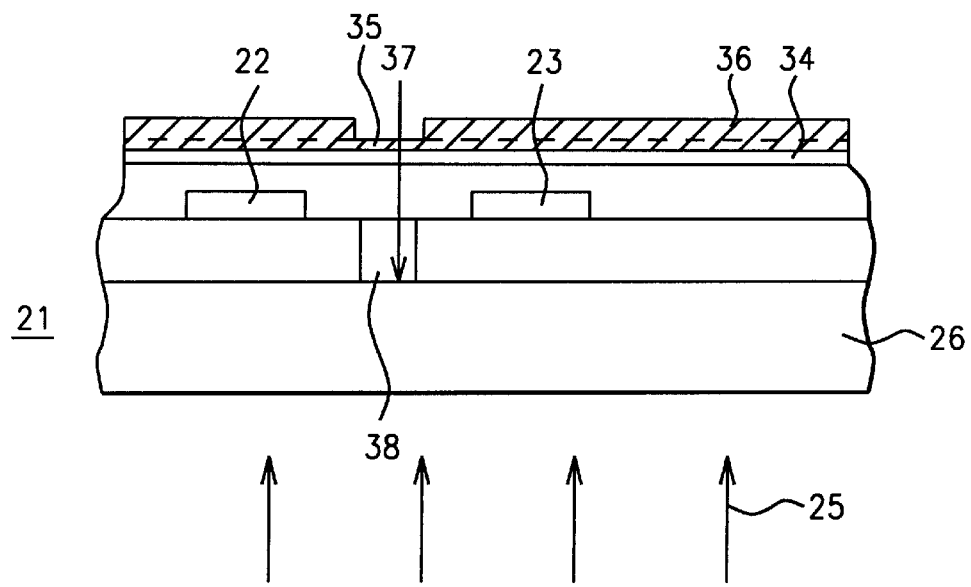
FIG. 4 illustrates the third embodiment of the invention which is a combination of the first and second embodiments.

Next, a layer of photoresist (not shown) is laid down over layer 35. This is exposed through a suitable mask and then developed, resulting in a resist pattern that covers 35 everywhere except where it is intended to grow an additional layer of metal over 35. This is layer 36 which is deposited by means of electroplating, to a thickness slightly less than that of the resist. Since the purpose of 36 is to block energetic protons, a material with relatively high atomic number is needed, such as Ni/Fe. Once the growth of 36 is complete, the resist is removed, resulting in the contact mask seen in FIG. 4. Note that it is not necessary to remove those portions of layer 35 that did not receive additional metal since, because of its low thickness, the extent to which it will attenuate a beam of protons (or other radiation) is negligible.

With a contact mask in place, bombardment of the upper surface by protons can begin. The proton beam is symbolized by arrow 37. The energy of the protons is between about 1 and 1.6 MeV. This value is selected so that the depth of the resulting semi-insulating region 37 is between about 15 and 30 microns, achieving a better result which could not have been obtained using the more expensive and time consuming trench methods which in practice can extend at most about 7 microns into the silicon. At these energies a proton fluence between about $10^{15}$ and $10^{16}$ protons/cm$^2$ was used. The resistivity of the silicon in region 38 prior to the proton bombardment was between about 1 and 10 ohm cm while after proton bombardment it had increased to between about $10^5$ and $5\times10^5$ ohm cm.

To conclude implementation of the third embodiment it is then necessary to bombard the back side of wafer 21 by protons. In practice the proton beam has a diameter between about 0.1 and 2 cm. and must therefore be scanned (in raster fashion) over the surface of the wafer to cover the entire area. We have found a proton fluence between about $10^{15}$ and $10^{16}$ protons/cm$^2$ to be suitable for this purpose. The energy of the protons is chosen to be between about 5 and 12 MeV. At these energies the protons penetrate nearly as far as the bottom surface of 38 thereby forming semi insulating region 26. The resistivity of the silicon in area 26 prior to the proton bombardment was between about 1 and 10 ohm cm while after proton bombardment it had increased to between about $10^5$ and $5\times10^5$ ohms cm.

We note here that as a variation on the third embodiment, it is possible to form the broad (back surface) irradiation of the wafer first, followed by the formation of the local semi-insulating regions (front surface irradiation through a mask).

While the invention has been particularly shown and described with reference to the preferred embodiments thereof, it will be understood by those skilled in the art that various changes in form and details may be made without departing from the spirit and scope of the invention.

What is claimed is:

1. A process to provide a semi-insulating substrate for an integrated circuit, in a semi-conductor wafer having upper and lower surfaces, comprising:

providing a fully formed integrated circuit, further comprising active and passive components and including electrical isolation regions that extend downward from said upper surface; and directing energetic protons to pass through said lower surface into a region of the wafer above said lower surface to form a semi-insulating layer that extends upwards from the lower surface as far as the electrical isolation regions.

2. The process of claim 1 wherein said electrical isolation regions comprise trenches filled with dielectric material.

3. The process of claim 1 wherein the semiconductor is selected from the group consisting of silicon, germanium, gallium arsenide, silicon-germanium, indium phosphide, and gallium nitride.

4. The process of claim 1 wherein the step of directing energetic protons further comprises scanning a proton beam in a raster pattern.

5. The process of claim 4 wherein the proton beam has a diameter between about 0.1 and 2 cms.

6. The process of claim 1 wherein the protons have an energy that is between about 5 and 12 MeV.

7. The process of claim 1 wherein the proton fluence between about $10^{15}$ and $10^{16}$ protons/cm$^2$.

8. The process of claim 1 wherein said region of the wafer, before the protons pass through, has a resistivity between about 1 and 10 ohm-cm.

9. The process of claim 1 wherein the semi-insulating layer has a resistivity between about $10^5$ and $5\times10^5$ ohm-cm.

10. A process for electrically isolating a region within a integrated circuit comprising:

providing a semiconductor wafer having an upper surface and containing an integrated circuit that further comprises active components, passive components, interconnection wiring, inter-metal dielectric layers, and an uppermost passivation layer;

on said passivation layer, depositing a first layer of metal;

on said first metal layer depositing a layer of photoresist having a thickness;

exposing and developing the photoresist layer to uncover selected portions of said first metal layer;

by means of electro-plating, depositing a second layer of metal on said uncovered portions to a thickness less than the thickness of the photoresist;

removing the photoresist, thereby forming a contact mask on said upper surface of the passivation layer;

through said contact mask, bombarding said upper surface with protons whereby semi-insulating regions, that provide electrical isolation, are formed wherever said passivation layer is not covered by the contact mask; and removing the contact mask.

11. The process of claim 10 wherein the semi-insulating regions extend downward, from said upper surface of the wafer, between about 15 and 30 microns.

12. The process of claim 10 wherein the protons have an energy that is between about 1 and 1.6 MeV.

13. The process of claim 10 wherein the proton fluence is between about $10^{15}$ and $10^{16}$ protons/cm$^2$.

14. The process of claim 10 wherein said regions of the wafer not covered by the contact mask, before the protons pass through, have a resistivity between about 1 and 10 ohm-cm.

15. The process of claim 10 wherein the semi-insulating regions have a resistivity between about $10^5$ and $5 \times 10^5$ ohm-cm.

16. The process of claim 10 wherein the thickness of the photoresist is between about 5 and 10 microns.

17. The process of claim 10 wherein the first metal layer has a thickness between about 100 and 1,000 Angstroms and is selected from the group consisting of chromium, gold, iron, and aluminum.

18. The process of claim 10 wherein the second metal layer has a thickness between about 5 and 10 microns and is selected from the group consisting of nickel, iron, Ni/Fe alloy, gold, and aluminum.

19. A process for providing full electrical isolation between circuits in a semiconductor, comprising;

providing a semiconductor wafer having an upper and a lower surface and containing an integrated circuit that further comprises active components, passive components, interconnection wiring, inter-metal dielectric layers, and an uppermost passivation layer;

on said passivation layer, depositing a first layer of metal;

on said first metal layer depositing a layer of photoresist having a thickness;

exposing and developing the photoresist layer to uncover selected portions of said first metal layer;

by means of electro-plating, depositing a second layer of metal on said uncovered portions to a thickness less than the thickness of the photoresist;

removing the photoresist, thereby forming a contact mask on said upper surface of the passivation layer;

through said contact mask, bombarding said upper surface with protons whereby first semi-insulating regions, that provide electrical isolation, are formed wherever said passivation layer is not covered by the contact mask;

removing the contact mask; and then directing energetic protons to pass through said lower surface into a region of the wafer above said lower surface to form a second semi-insulating region that extends upwards from the lower surface as far as the first semi-insulating regions.

20. The process of claim 19 wherein said regions of the wafer not covered by the contact mask, have a resistivity, before the protons pass through, between about 1 and 10 ohm-cm. and the region that extends upwards from the lower surface as far as the first semi-insulating regions, has a resistivity, before the protons pass through, between about 1 and 10 ohm-cm.

* * * * *